United States Patent [19]
Murota

[11] Patent Number: 5,257,027
[45] Date of Patent: Oct. 26, 1993

[54] MODIFIED SIGN-MAGNITUDE DAC AND METHOD

[75] Inventor: Toshio Murota, Kanagawa, Japan

[73] Assignee: Burr-Brown Corporation, Tucson, Ariz.

[21] Appl. No.: 916,595

[22] Filed: Jul. 20, 1992

[51] Int. Cl.$^5$ .............................................. H03M 1/80
[52] U.S. Cl. ...................................... 341/153; 341/144
[58] Field of Search ............... 341/144, 118, 127, 144, 341/145, 136, 153

[56] References Cited

U.S. PATENT DOCUMENTS

| | | | |
|---|---|---|---|
| 3,221,323 | 11/1965 | Beck | 340/347 |
| 4,346,368 | 8/1982 | Johnson | 341/127 |
| 4,473,818 | 9/1984 | Youngquist | 340/347 |
| 4,490,714 | 12/1984 | van de Plassche | 340/347 |
| 4,918,447 | 4/1990 | Michel | 341/144 |
| 4,972,188 | 11/1990 | Clement et al. | 341/118 |
| 5,017,918 | 5/1991 | Matsusako | 341/118 |

Primary Examiner—A. D. Pellinen
Assistant Examiner—Brian K. Young
Attorney, Agent, or Firm—Cahill, Sutton & Thomas

[57] ABSTRACT

A modified sign-magnitude DAC includes first internal DAC circuitry including a first number of bit switch circuits responsive to an input word including a sign bit and a digital data word. Each bit switch circuit is coupled to a corresponding current source transistor. Second internal DAC circuitry includes the same number of bit switch circuits responsive to the input word. Each bit switch circuit of the second internal DAC circuitry is coupled to a corresponding current source transistor. The same number of binarily weighted bit current determining resistor circuits corresponding to bits of the digital data word are connected to a reference voltage conductor. The emitter of the current source transistor of each bit switch circuit of the first internal DAC circuitry is coupled by a first gain balancing resistor to the corresponding bit current determining resistor. The emitters of the current source transistor of each bit switch circuit of the second internal DAC circuitry is connected by a second gain balancing resistor to the same corresponding bit current determining resistor. The sharing of the bit current determining resistor reduces the number required by half, and also reduces the physical size of each by half, since its resistance is halved for the same bit current magnitude.

8 Claims, 2 Drawing Sheets

5,257,027

MODIFIED SIGN-MAGNITUDE DAC AND METHOD

BACKGROUND OF THE INVENTION

The invention relates to a modified sign-magnitude DAC, and particularly to an improvement for sharing bit current determining resistors for each bit of the modified sign-magnitude DAC between internal first and second DAC sections thereof, and to a technique for balancing gains of the internal first and second DAC sections for each bit.

In a sign-magnitude DAC (digital-to-analog converter), the most significant bit of the digital input word is a "sign bit" which indicates that the remaining bits of the digital word represent a positive number if the sign bit is a "1" and a negative number if the sign bit is a "0"8. A conventional sign-magnitude DAC includes two separate internal DAC sections, one for converting positive input numbers to an analog output current voltage, the other for converting negative input numbers to a corresponding output current. The bit switches of both the two internal DAC sections are summed in the same current summing conductor. The sign bit of the digital input word is used to switch between the "positive" internal DAC section and the "negative" internal DAC section.

FIG. 4 shows an internal structure for the same bit of both the internal DAC sections for a conventional sign-magnitude DAC. Dotted line 110 encloses a typical bit circuit for one of the internal DAC sections referred to as "DACA". The DACA bit circuit includes bit switch 15,16 and a laser-trimmable bit current-determining resistor 270 and NPN transistor 17. Dotted line 120 encloses the corresponding bit circuit, of the other internal DAC section (referred to as "DACB") for the same bit. More specifically, bit 120 includes bit switch 19,20, NPN transistor or 18, and trimmable bit current determining resistor 280.

A precise bias voltage $V_{BIAS}$ is applied to the base electrodes of NPN transistors 17 and 18, the emitters of which apply a precise voltage across the current-determining resistors 270 and 280. Control circuitry (not shown) responsive to the digital input word applies appropriate bit switch selection signals to bit switch MOSFET gate electrodes 24 and 25, of bit switch 15,25, depending on whether the corresponding bit of the present digital input word is a "1" or a "0", if the present digital input word is a positive number. If the present digital input word is a negative number, appropriate bit selection signals are applied by the control circuitry to MOSFET gate electrodes 26 and 29 of bit switch 19,20, depending on whether the corresponding bit of the digital input word is "1" or a "0".

In conventional sign-magnitude DACs, the internal DACA and DACB sections are located in substantially separated areas of an integrated circuit chip. Bit-current determining resistors 270 and 280 therefore also are located in substantially separated chip areas. Current source transistors 17 and 18 also are located in substantially separated areas of the chip. At the present state of the art, the base-to-emitter voltages of transistors 17 and 18 may be different, often by as much as one to five millivolts, depending on the manufacturing process and transistor geometrics. Since it is essential that the "gains" of the DACA and DACB sections be identical to avoid harmonic distortion of output signals produced in response to input signals such as digital audio input signals, bit current determining resistors 270 and 280 must be trimmed or adjusted during manufacture to compensate for the above differences in the base-to-emitter voltages of transistors 17 and 18, and also to compensate for process-dependent differences in the values of resistors 270 and 280. The more adjustability or "trimmability" that is needed for bit-current-determining resistors, the larger is the amount of chip area that they must occupy. Furthermore, the more transistors there are in an integrated circuit, and the greater the spacing between transistors thereon which need to be precisely matched, the more susceptible the integrated circuit is to parameter shifts induced by the integrated circuit packaging process being used.

There is a presently unmet need for a DAC capable of converting positive and negative input digital numbers to a corresponding AC analog output signal in as little chip area as possible, with balanced gain of the internal "DACA" and "DACB" sections to reduce harmonic distortion of the digital input word as much as possible.

SUMMARY OF THE INVENTION

Accordingly, it is an object of the invention to provide a modified sign-magnitude DAC that requires less integrated circuit chip area than previous sign-magnitude DACs, yet has precisely balanced gains of the internal DAC stages so as to eliminate distortion in the conversion of a digital input signal, especially a time-varying digital input signal.

Briefly described, and in accordance with one embodiment thereof, the invention provides a modified sign-magnitude DAC including first internal DAC circuitry having a first number of bit switch circuits responsive to an input word including a sign bit and a digital data word, and second internal DAC circuitry having the same number of bit switch circuits responsive to the input word. Each bit switch circuit is coupled to a corresponding current source transistor. A first number of binarily weighted bit current determining resistor circuits, corresponding to bits of the digital data word, are coupled between a reference voltage conductor and the emitters of the current source transistors of the first internal DAC circuitry and the second internal DAC circuitry. A decoding circuit stores a first group of codes converting each of the possible values of the input word to bit switch input signals for each of the bit switch circuits of the first internal DAC circuitry and a second group of codes converting each of the possible values of the input word to bit switch input signals for each of the bit switch circuits of the second internal DAC. Each bit current determining resistor circuit includes a relatively high resistance, trimmable bit current determining resistor primarily determining the bit current for its corresponding bit switch circuit, and relatively low resistance, trimmable first and second gain balancing resistors each connected between the bit current determining resistor and the emitters of the current source transistors of the first and second internal DAC circuitry corresponding to that bit. The bit switch circuits each include first and second MOSFETs, the first MOSFET having a gate electrode connected to receive a bit switch signal according to the state of the corresponding bit of a digital data word and sign bit of a present input word, a source connected to the collector of the current source transistor, and a drain electrode connected to a current summing conductor. The second MOSFET has a gate electrode connected to receive the logical complement of the bit switch signal, a source electrode connected to the collector of the current source transistor, and a drain connected to a bit current waste conductor.

DETAILED DESCRIPTION OF THE PREFERRED EMBODIMENTS

Figure 1:
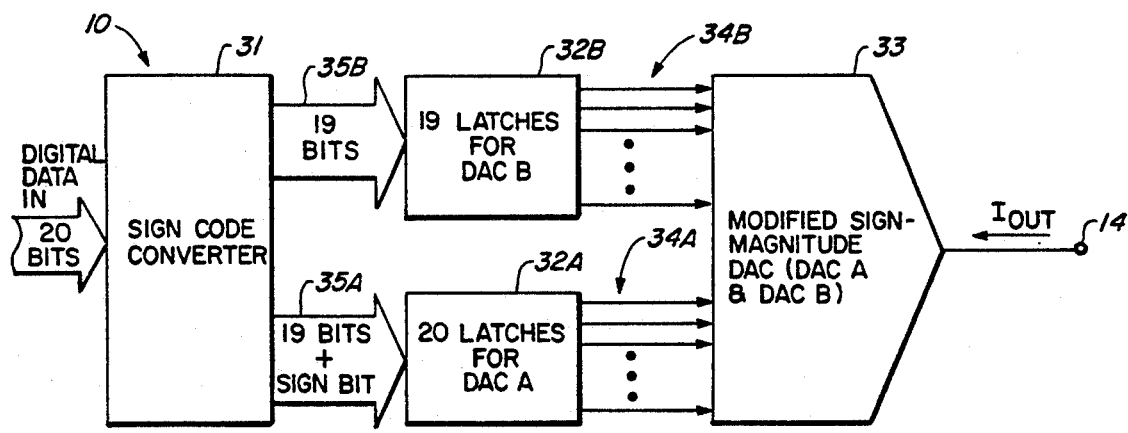
FIG. 1 is a block diagram of the modified sign-magnitude DAC of the present invention.

Modified sign-magnitude DAC 10 is shown in FIG. 1. A 20 bit digital input word is applied to a sign code converter 31. The digital input word includes a sign bit followed by a data field containing a 19 bit data word. Sign code conversion circuitry 31 converts the various 19 bits of the input data word to 39 bit switch signals, 20 of which are conducted by bus 35A to inputs of a 19 bit latch circuit 32A, the other 19 bit switch signals being conducted by bus 35B to the inputs of a 19 bit latch circuit 32B. Latch circuit 32A is designated in FIG. 1 as the "latch for DACA", and latch circuit 32B is designated as the "latch for DACB". (The 20 bit switch signals on bus 35A include 19 bit switch signals plus one sign bit signal, as shown at 35A and 32A of FIG. 1.)

Latch 32A produces bit switch input signals on 40 output conductors 34A which are connected to the gate electrodes of various bit switch MOSFETs in the DACA section of modified sign-magnitude DAC circuitry 33. Similarly, latch 32B produces bit switch signals on 38 bit switch selection conductors 34B which are applied to the gate electrodes of the various bit switch MOSFETs in the internal DACB section of modified sign-magnitude DAC circuitry 33. The output of modified sign-magnitude DAC circuitry 33 is the current $I_{OUT}$ flowing in conductor 14 as shown in FIG. 1.

Sign code conversion circuitry 31 includes a read-only memory (ROM) that stores the input code conversion information shown in Table 1. In Table 1, the left hand column shows the possible values for the first 6 most significant bits of the above-mentioned 20 bit input data word. These values range from the positive full scale number 111111 to the bit bipolar zero crossing point (BPZ) 100000, down to the negative full scale number 000000. The first (left) bit of each of the numbers in Table 1 is the sign bit, so all of the numbers in the upper part of the left column are positive numbers, and all of the numbers in the lower part of the left column are negative numbers. The progression shown is in the order of increasing binary numbers from the most negative number 000000 to the most positive number 111111.

TABLE 1

| 6 MSB's OF DIGITAL INPUT WORD | 5 MSB's OF INTERNAL DACA | 5 MSB's OF INTERNAL DACB |
|---|---|---|
| SIGN BITS - - - | | |
| 1 11111 | | 11111 |
| 1 11110 | | 11110 |
| 1 11101 | | 11101 |
| 1 11100 | | 11100 |
| 1 11011 | | 11011 |
| 1 11010 | | 11010 |
| 1 11001 | | 11001 |
| 1 11000 | | 11000 |
| 1 10111 | | 10111 |
| 1 10110 | | 10110 |
| 1 10101 | | 10101 |
| 1 10100 | | 10100 |
| 1 10011 | | 10011 |
| 1 10010 | | 10010 |
| 1 10001 | 11111 + 1LSB | 10001 |
| 1 10000 | | 10000 |
| 1 01111 | | 01111 |
| 1 01110 | | 01110 |
| 1 01101 | | 01101 |
| 1 01100 | | 01100 |
| 1 01011 | | 01011 |
| 1 01010 | | 01010 |
| 1 01001 | | 01001 |
| 1 01000 | | 01000 |
| 1 00111 | | 00111 |
| 1 00110 | | 00110 |
| 1 00101 | | 00101 |
| 1 00100 | | 00100 |
| 1 00011 | | 00011 |
| 1 00010 | | 00010 |
| 1 00001 | | 00001 |
| 1 00000 | | 00000 |
| 0 11111 | 11111 | |
| 0 11110 | 11110 | |
| 0 11101 | 11101 | |
| 0 11100 | 11100 | |
| 0 11011 | 11011 | |
| 0 11010 | 11010 | |
| 0 11001 | 11001 | |
| 0 11000 | 11000 | |
| 0 10111 | 10111 | |
| 0 10110 | 10110 | |
| 0 10101 | 10101 | |
| 0 10100 | 10100 | |
| 0 10011 | 10011 | |
| 0 10010 | 10010 | |
| 0 10001 | 10001 | 00000 |
| 0 10000 | 10000 | |
| 0 01111 | 01111 | |
| 0 01110 | 01110 | |
| 0 01101 | 01101 | |
| 0 01100 | 01100 | |
| 0 01011 | 01011 | |
| 0 01010 | 01010 | |
| 0 01001 | 01001 | |
| 0 01000 | 01000 | |
| 0 00111 | 00111 | |
| 0 00110 | 00110 | |
| 0 00101 | 00101 | |
| 0 00100 | 00100 | |
| 0 00011 | 00011 | |
| 0 00010 | 00010 | |
| 0 00001 | 00001 | |
| 0 00000 | 00000 | |

Figure 2:
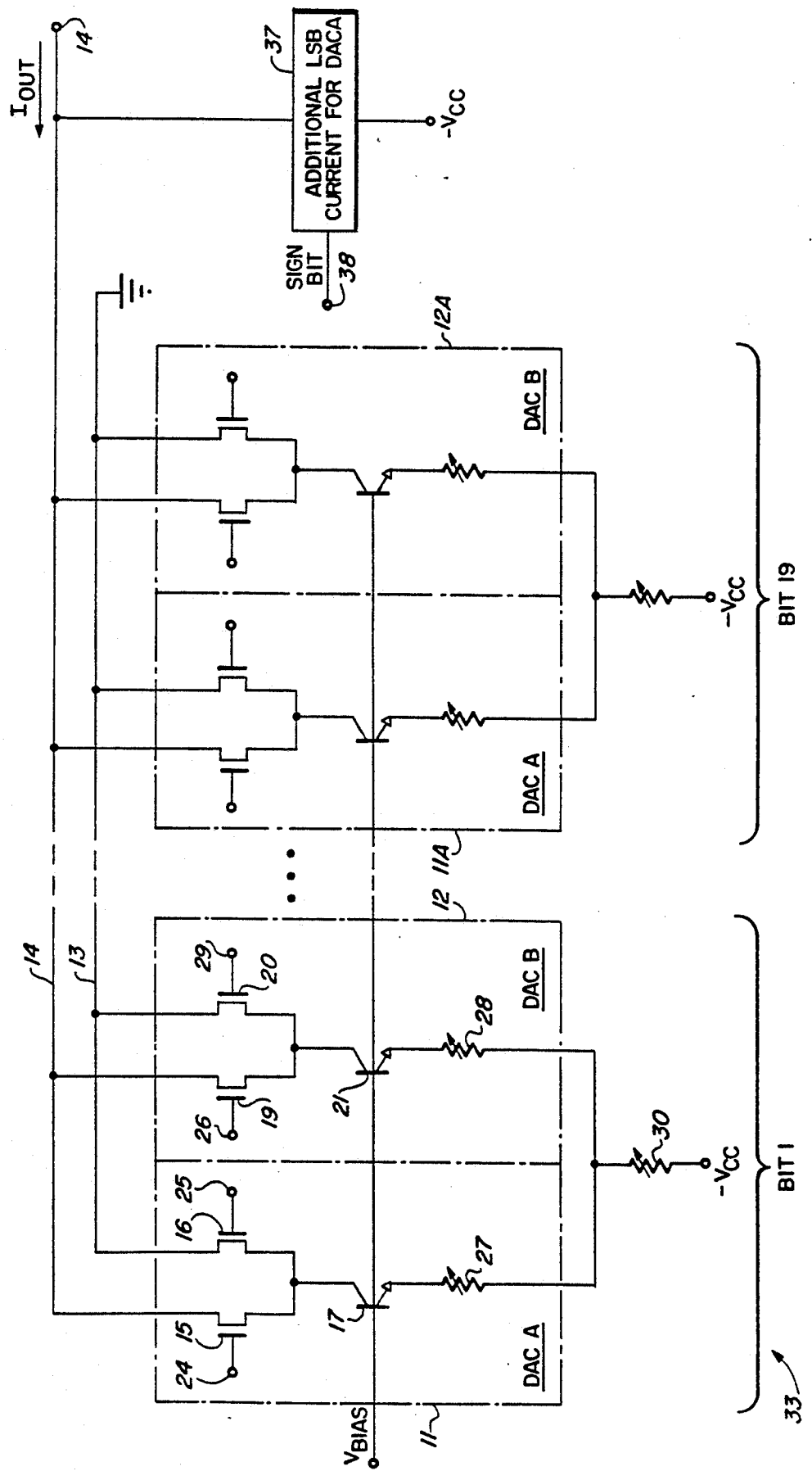
FIG. 2 is a schematic circuit diagram illustrating typical bit circuits of the first and second internal DAC sections which for each bit share the same bit current determining resistor in the preferred embodiment of the invention.

The middle column of Table 1 shows the bit switch signals produced by sign code conversion circuitry 31 and applied by the 20 bus conductors 35A and the non-inverting outputs of corresponding latches 32A in FIG. 1 to the gate electrodes shown in FIG. 2 of the various left bit current switch MOSFETs such as 15 of DACA. Each latch in block 32A also has an inverting or complement output which is applied to the gate electrode of a corresponding right MOSFET, such as MOSFET 16 in FIG. 2. (Those skilled in the art will know that for each bit switch, the gate electrodes of its two MOSFETs are at complementary logical levels, so that one of the bit switch MOSFETs is on and the other one is off.)

Similarly, the right hand column of Table 1 shows the bit switch signals produced by sign code conversion circuitry 31 and applied by the 19 bus conductors 35B and the non-inverting outputs of the 19 latches 32B in FIG. 1 to the gate electrodes shown in FIG. 2 of the left bit current switch MOSFETs such as 19 of DACB. Each latch in block 32B also has an inverting or complement output which is applied to the gate electrode of a corresponding right MOSFET, such as MOSFET 20 of DACB in FIG. 2.

In FIG. 2, the internal bit switch circuitry and associated bit current source circuitry are shown for two of the 19 bits in modified sign-magnitude DAC circuitry 33 of FIG. 1. Dotted lines 11 and 12 encompass the bit switch circuitry of both DACA and DACB for the most significant bit, i.e., "bit 1", of the 19 bit input data word contained in the 20 bit digital input word, bit 1(MSB) of the 20 bit digital input word being the sign bit. Dotted lines 11A and 12A show the corresponding bit switch circuitry for the least significant bit 19 of the 19 bit digital input number. The bit circuitry for the other 17 bits of the 19 bit input data word is similar. The bit switch circuitry for bit 1 of DACA includes N channel bit switch MOSFETs 15 and 16, having their source electrodes connected together to the collector of NPN current source transistor 17. The gate electrode of MOSFET 15 is connected to one of conductors 34A of FIG. 1 from a latch in block 32A of FIG. 1 corresponding to bit 1. The logical complement output of that same latch is connected to the gate electrode 25 of N channel MOSFET 16.

The drain electrode of MOSFET 15 is connected to current summing conductor 14. The drain electrode of MOSFET 16 is connected to electrically grounded "waste" bit current conductor 13. The base electrode of NPN current source transistor 17 is connected to $V_{BIAS}$, and its emitter electrode is connected to one electrode of nichrome laser-trimmable gain balance resistor 27, the other terminal of which is connected by conductor 21 to one electrode of nichrome laser-trimmable, binarily weighted bit current determining resistor 30. The lower terminal of bit current determining resistor 30 is connected to $-V_{CC}$.

N channel bit switch MOSFETs 19 and 20 of bit 1 of DACB have their source electrodes connected together and to the collector of NPN current source transistor 21, the base of which is connected to $V_{BIAS}$. The drain electrodes of MOSFETs 19 and 20 are connected to current summing conductor 14 and waste current conductor 13, respectively. The gate electrodes 26 and 29 of MOSFETs 19 and 20 are connected to a pair of conductors 34B in FIG. 1 which are connected to the output and complement signals of a corresponding latch in latch circuit 32B. The emitter of current source transistor 21 is connected to nichrome laser-trimmable gain balance resistor 28, the lower terminal of which is connected by conductor 21 to the binarily weighted bit current determining resistor 30.

The structure of the bit switch and bit current determining circuitry for each of the remaining 18 bits of both the DACA and DACB sections of modified sign-magnitude DAC 10 is essentially the same as for bit 1, with the bit current determining resistors such as 30 being binarily weighted relative to each other in a conventional manner.

In accordance with one aspect of the present invention, both the internal DACA and DACB sections of the bit switch circuitry for each bit share the same binarily weighted bit current determining resistor. For example, for bit 1, bit switch 15,16 of DACA and bit switch 19,20 of DACB both share the same binarily weighted bit current determining resistor 30. Note the contrast of FIG. 2 to the prior art circuit of FIG. 4, in which bit switch 15,16 is connected only to bit current determining resistor 270 for the DACA section, and (for the same bit) bit switch 19,20 is connected only to a separate binarily weighted bit current determining resistor 280, which is likely to be located in a substantially different area of the integrated circuit chip than bit current determining resistor 270.

Figure 4:
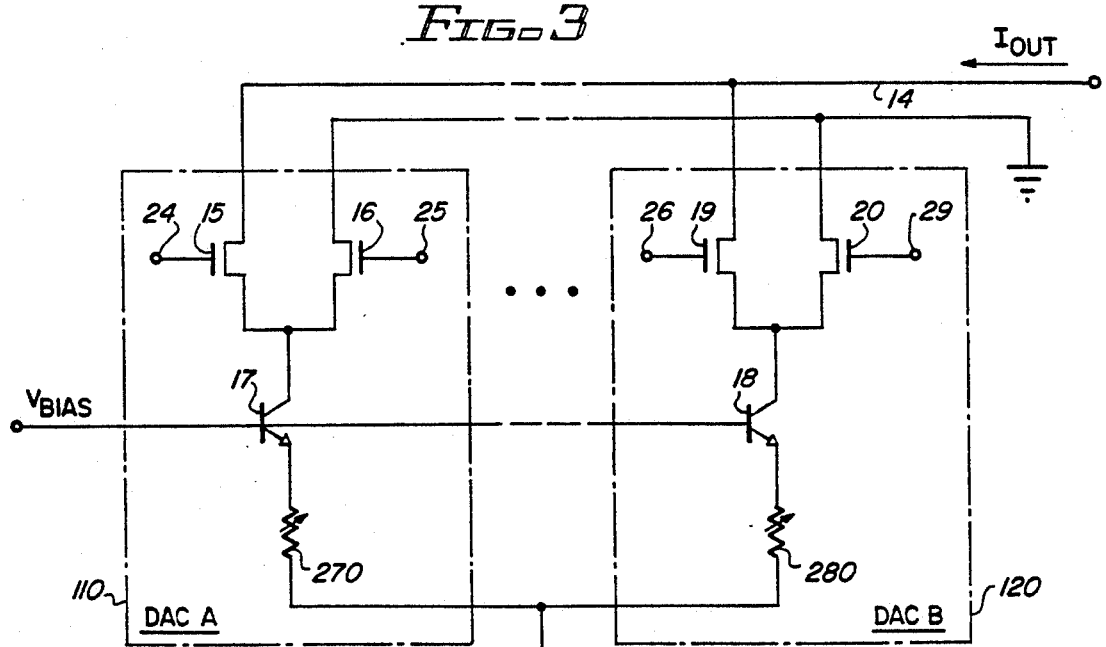
FIG. 4 is a circuit diagram of internal bit circuits of a prior art sign-magnitude DAC.

It should be appreciated that if the same current flows into current summing conductor 14 in FIG. 2 as flows into current summing conductor 14 in FIG. 4 for a corresponding bit, then the resistance of bit current determining resistor 30 in FIG. 2 can be half the resistance of each of bit current determining resistors 270 and 280 in FIG. 4. This is true because in FIG. 2 the bit switch currents for both the DACA and DACB sections flow through the same bit current determining resistor 30, whereas in FIG. 4, a separate bit current flows through each of bit current determining resistors 270 and 280.

Furthermore, only half as many bit current determining resistors such as 30 are needed in the circuit of FIG. 2 as in the prior art circuit of FIG. 4. Consequently, the amount of area of the integrated circuit chip for the binarily weighted bit current determining resistors for the inventive configuration of FIG. 2 is only approximately one-fourth of the chip area required for the bit current determining resistors such as 270 and 280 of FIG. 4.

Referring to FIG. 2, gain balance resistor 27 for DACA and gain balance resistor 28 for DACB of bit 1 are laser trimmed during manufacture of the integrated circuit to balance the gains for bit 1 of DACA and DACB. Bit current determining resistor 30 is laser trimmed to cause bit 1 to make the proper binarily weighted current contribution to $I_{OUT}$ of modified sign-magnitude DAC 10. Trimming of the single bit current determining resistor 30 accomplishes setting of both the DACA and DACB bit weight associated with that bit.

In FIG. 2, the resistances of gain balance resistors 27 and 28 are small compared to the resistance of bit current determining resistor 30. An exemplary value of bit current determining resistor 30 would be 5.5 kilohms, whereas nominal values of gain balance resistors 27 and 28 would be approximately 3.1 kilohms.

Figure 3:
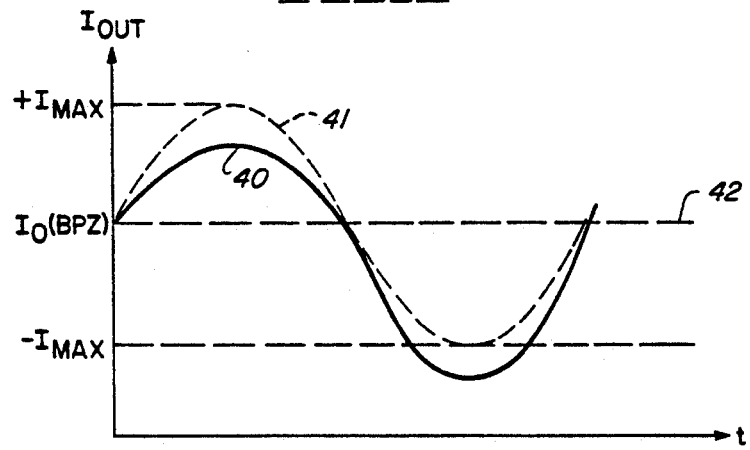
FIG. 3 is a graph useful in describing the balancing of gains of the internal first and second internal DAC sections in FIG. 2 to avoid harmonic distortion of analog output signals produced in response to the digital input signal.

To better understand the need for balancing the gains of the DACA and DACB sections to reduce harmonic distortion, it is helpful to refer to FIG. 3, in which the analog output current $I_{OUT}$ is shown versus time. Dotted line 41 represents an ideal sinusoidal signal represented by increasing the value of the 20 bit digital input word from a bipolar zero (BPZ) value $I_0$ to its maximum positive full scale value $+I_{MAX}$, decreasing it back through the BPZ value to its maximum negative or negative full scale value $-I_{MAX}$, and then increasing it back to the bipolar zero level $I_0$. The positive and negative portions of the sinusoidal waveform 41 are symmetrical, so it contains no harmonic distortion.

If the gains of the both DACA and DACB sections are not precisely equal, the shape of the output current waveform of $I_{OUT}$ will not precisely match the shape of the ideal signal waveform 41. For example, if the gain of the DACB section is somewhat too low and the gain of DACA section is somewhat too high, then the distorted sine wave indicated by solid line $I_{OUT}$ waveform 40 in FIG. 3 will occur, containing a considerable amount of harmonic distortion.

In accordance with the present invention, a bit of DACA is turned "on" so as to contribute its bit current to $I_{OUT}$ in current summing conductor 14, and a corresponding bit of DACB is turned "off" so as to contribute its bit current to waste current conductor 13. $I_{OUT}$ is measured under these conditions. Then that bit of DACB is turned "on" and that bit of DACA is turned "off", and $I_{OUT}$ is measured again. If the absolute value of the first $I_{OUT}$ measurement exceeds the second, gain balance resistor 27 is too low in value, and is laser-trimmed to decrease the value of $I_{OUT}$ with DACA "on" and DACB "off" to equal the second measurement of $I_{OUT}$. If the absolute value of the second $I_{OUT}$ measurement exceeds the first, gain balance resistor 28 is too low in value, and is laser-trimmed to increase its resistance and hence the value of $I_{OUT}$ with DACB "on" and DACA "off" to equal the first measurement of $I_{OUT}$. After this "gain balancing" has been completed, bit current determining resistor 30 is laser-trimmed so that the sum of the absolute values of $I_{OUT}$ with DACA "on" and DACB "off" and $I_{OUT}$ with DACB "on" and DACA "off" is equal to what the desired binarily weighted current for that bit would be if separate bit current determining resistors 270 and 280 as in FIG. 6 were used instead. Gain balance resistor 28 and bit current determining resistor 30 are laser-trimmed as necessary to cause the upper portion of $I_{OUT}$ waveform 40 to coincide with the upper portion of the ideal signal waveform 41. Gain balance resistor 27 and bit current determining resistor 30 are laser-trimmed as necessary to make the lower portion of $I_{OUT}$ waveform 40 coincide with the lower portion of the ideal signal waveform 41.

The operation of modified sign-magnitude DAC 10 can be further understood with reference to Table 1, FIG. 1, and FIG. 3.

Referring to Table 1, for the range of values of the 20 bit digital input word (including the sign bit and 19 bit input data word) from 100000 to 111111, the bits of DACA are set by sign code conversion circuitry 31 to a 11111 condition plus an additional 1 LSB current provided by additional LSB current circuit 37 in FIG. 2 when the sign bit is a "1".

For the same range of values, the 19 bit digital input word is applied to DACB via sign code conversion circuitry 31, bus 35B, DACB Latch 32B, and bus 34B to produce the upper portion of $I_{OUT}$ waveform 40 in FIG. 3. The 14 less significant bits of the 20 bit digital input data word and the remaining corresponding bits in the DACA and DACB sections follow a similar pattern, but for convenience of illustration are not shown in Table 1.

For negative values of the digital input word in which the sign bit is "0", Table 1 shows that the corresponding bits of DACA vary between all "0"s and all "1"s to produce the $I_{OUT}$ variation for the lower or "negative" portion of $I_{OUT}$ waveform 40 in FIG. 3 below the bipolar zero crossing level $I_0$. For the same digital input word range, the DACB section is completely off, as indicated by the "0"s in the lower half of the right hand column of Table 1. The 14 less significant bits of the negative digital input word also are not shown in Table 1, but follow a similar pattern.

Thus, if all of the DACA gain balance resistors such as 27 and all of the DACB gain balance resistors such as 28 are laser-trimmed during manufacture to insure that equal bit currents flow through DACA and DACB for each bit, then the upper portion of $I_{OUT}$ waveform 40 in FIG. 3 will match the 19 bit ideal waveform 41 in FIG. 3, and $I_{OUT}$ will contain very little harmonic distortion.

Furthermore, this benefit will be accomplished with substantially less time-consuming laser trimming than is required for the prior art circuit of FIG. 4. The amount of chip area required for the weighted bit current resistors such as 30 will be reduced by a factor of approximately four, resulting in substantially lower manufacturing costs.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention. For example, gain balancing between DACA and DACB theoretically could be achieved by trimming metal connections to disconnect individual emitter areas of transistors 17 and 21, to thereby match the $V_{BE}$ voltages thereof. Or, trimmable "bleeder" current source circuits theoretically could be connected to the emitters of transistors 17 and 21 respectively, to match the $V_{BE}$ voltages of transistors 17 and 21 and thereby balance the gains of DACA and DACB.

What is claimed is:

1. A sign-magnitude DAC receiving an input word including a sign bit and a digital data word, comprising in combination:

(a) first internal DAC circuitry including a first number of bit switch circuits responsive to the input word, each bit switch circuit being coupled to a corresponding current source transistor, and second internal DAC circuitry including the first number of bit switch circuits responsive to the input word, each bit switch circuit of the second internal DAC circuitry being coupled to a corresponding current source transistor; and (b) a first number of binarily weighted bit current determining resistor circuits corresponding to bits of the digital data word, respectively, each bit current determining resistor circuit being coupled between a reference voltage conductor and the emitters of the current source transistors of the first internal DAC circuitry and the second internal DAC circuitry corresponding to that bit.

2. The sign-magnitude DAC of claim 1 including decoding circuitry storing a first group of codes converting each of the possible values of the input word to bit switch input signals for each of the bit switch circuits of the first internal DAC circuitry and a second group of codes converting each of the possible values of the input word to bit switch input signals for each of the bit switch circuits of the second internal DAC.

3. The sign-magnitude DAC of claim 1 wherein each bit current determining resistor circuit includes a high resistance bit current determining resistor primarily determining the bit current for its corresponding bit switch circuit and a relatively low resistance first and second gain balancing resistors each connected between one end of the bit current determining resistor and in emitters of the current source transistors of the first and second internal DAC circuitry, respectively, corresponding to that bit.

4. The sign-magnitude DAC of claim 3 wherein in each bit current circuit the bit current determining resistor and the first and second gain balancing resistors are laser trimmable nichrome resistors.

5. The sign-magnitude DAC of claim 4 wherein the bit switch circuits each include first and second MOSFETs, the first MOSFET having a gate electrode connected to receive a bit switch signal according to the state of the corresponding bit of a digital data word and sign bit of a present input word, a source connected to the collector of the current source transistor, and a drain electrode connected to a current summing conductor, the second MOSFET having a gate electrode connected to receive the logical complement of the bit switch signal, a source electrode connected to the collector of the current source transistor, and a drain connected to a bit current waste conductor.

6. The sign-magnitude DAC of claim 5 wherein for all positive values of the input word, all of the bit switch circuits of the first DAC circuit are switched to supply "1's" and thereby supply a corresponding bipolar zero output current level in the summing conductor, and an auxiliary LSB bit current circuit is switched to cause an additional LSB current to flow in the summing conductor, and variation in the digital data word produces corresponding variation in the bit current switched by the second DAC circuit into the current summing conductor and thereby produces corresponding variations in the total current flowing in the summing conductor, and wherein for all negative values of the input word, all of the bit switch circuits of the second DAC circuit are switched to zero to switch the corresponding bit currents into a bit current waste conductor, and wherein variation in the digital data produces corresponding variations in the bit switch circuits of the first DAC circuit switching corresponding binarily weighted bit currents into the current summing conductor producing corresponding variation in the output current below the bipolar zero value.

7. A method of operating a DAC including first internal DAC circuitry and second internal DAC circuitry both responsive to an input word having a sign bit and a first number of data bits, a first number of bit switch circuits and corresponding current source transistors in the first internal DAC circuitry, a first number of bit switch circuits and corresponding current source transistors in the second internal DAC circuitry, a first number of binarily weighted bit current determining resistors, and a second number of gain balancing resistors, the second number being equal to twice the first number, the method comprising the steps of:

(a) for the first DAC circuitry, coupling an emitter of the current source transistor of each bit to a first terminal of a corresponding binarily weighted bit current determining resistor by means of a corresponding one of the gain balancing resistors, and for the second DAC circuitry, coupling an emitter of the current source transistor of each bit to the first terminal of a corresponding binarily weighted bit current determining resistor by means of a different corresponding one of the gain balancing resistors, a second terminal of each bit current determining resistor being coupled to a second reference voltage conductor; and (b) applying a bias voltage to the bases of each of the current source transistors to cause binarily weighted bit currents to flow in the bit current determining resistors, the gain balancing resistors being trimmed to produce balanced gains of the first and second DAC circuitry, whereby equal bit currents flow through corresponding bit switch circuits of the first and second internal DAC circuitry despite differences in base-to-emitter voltages of the current source transistors thereof.

8. A method of operating a DAC which converts an input word including a sign bit and a first number of data bits to an analog signal, the method comprising the steps of:

(a) providing first and second internal DAC circuits each including a first number of bit switch circuits;

(b) sharing currents in each of a first number of binarily weighted bit current determining resistors with a corresponding bit switch circuit of the first internal DAC circuits and a corresponding bit switch circuit of the second internal DAC circuits; and (c) balancing portions of the currents in each bit 12 current determining resistor equally between the corresponding bit switch circuits carrying the shared currents by means of first and second gain balancing resistors coupling that bit current determining resistor to the corresponding bit switch circuits of the first and second internal DAC circuits.

* * * * *